United States Patent [19]

Birth

[11] Patent Number: 5,509,011

[45] Date of Patent: Apr. 16, 1996

[54] TRANSMISSION SYSTEM FOR TIME-DIVISION MULTIPLEX SIGNAL TRANSMISSION

[75] Inventor: Winfrid Birth, Veitsbronn, Germany

[73] Assignee: U.S. Philips Corporation, New York, N.Y.

[21] Appl. No.: 278,475

[22] Filed: Jul. 20, 1994

[30] Foreign Application Priority Data

Jul. 24, 1993 [DE] Germany .................. 43 24 895.0

[51] Int. Cl.⁶ .................................................. H04B 1/02
[52] U.S. Cl. .................. 370/77; 370/95.3; 455/116; 455/126; 455/127; 375/296; 375/297; 332/155
[58] Field of Search .................... 455/126, 127, 455/126, 116; 370/77, 95.3; 375/296, 297; 332/155

[56] References Cited

U.S. PATENT DOCUMENTS

| | | | |
|---|---|---|---|
| 5,132,634 | 7/1992 | Svarez | 455/127 |
| 5,278,994 | 1/1994 | Black et al. | 455/126 |
| 5,426,641 | 6/1995 | Ayrashteh et al. | 455/116 |

FOREIGN PATENT DOCUMENTS 0462773  12/1991  European Pat. Off.

Primary Examiner—Hassan Kizou
Assistant Examiner—Seema S. Rao
Attorney, Agent, or Firm—Michael J. Balconi-Lamica; Leroy Eason

[57] ABSTRACT

A time-division multiplex signal transmission system includes a transmitter having a power amplifier with a control input to which is supplied a control voltage ($U_c$). The power of the amplifier high-frequency output signal ($RF_{out}$) is detected by a detector which produces a detector voltage representing the sum of a detector quiescent voltage ($U_o$) and an actual detected signal voltage ($U_{ist}$). The control voltage ($U_c$) is generated from the difference between the detector voltage ($U_o+U_{ist}$) and a nominal voltage ($U_{soll}$) which is superimposed on the detector quiescent voltage ($U_o$). The nominal voltage ($U_{soll}$) determines the waveform of the power of the output signal ($RF_{out}$).

8 Claims, 5 Drawing Sheets

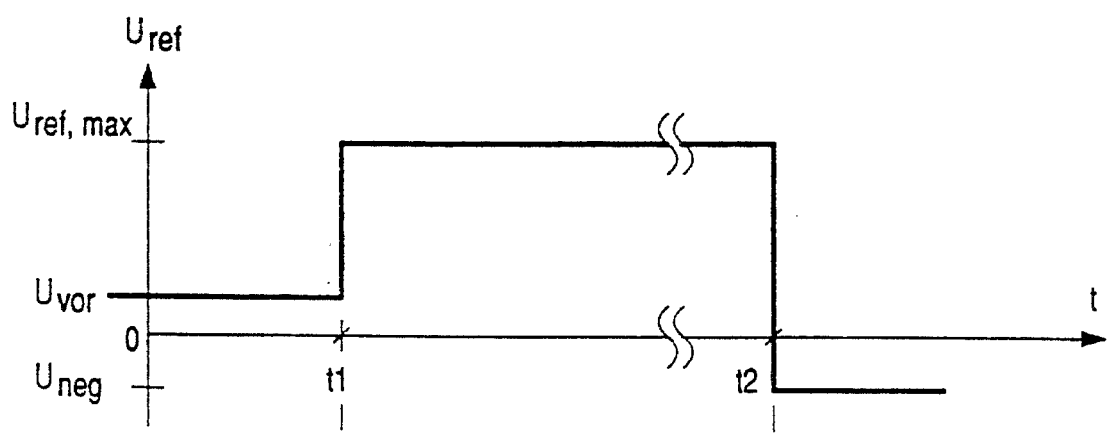
FIG. 7a
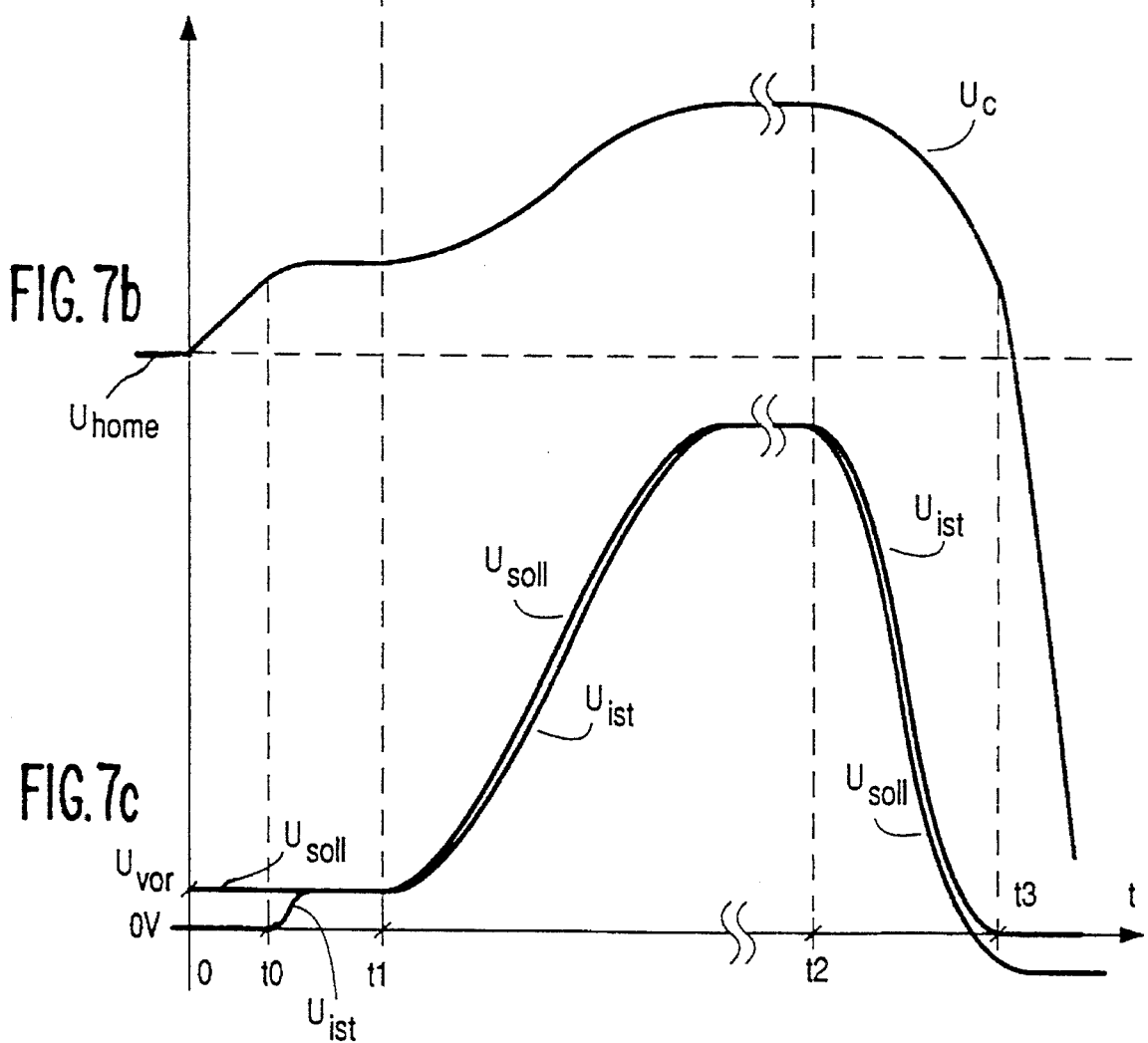
FIG. 7b
FIG. 7c

TRANSMISSION SYSTEM FOR TIME-DIVISION MULTIPLEX SIGNAL TRANSMISSION

BACKGROUND OF THE INVENTION

1. Field of the Invention

The invention relates to a time-division multiplex signal transmission, system comprising a transmitter which includes a power amplifier having a control input supplied with a control voltage, for amplifying a high-frequency input signal. A detector detects the power of the output signal, the detector voltage representing the sum of a detector quiescent voltage and an actual detected voltage. The invention furthermore relates to a transmitter and a control circuit used in such a transmission system.

The transmission system may, for example, be a mobile radio system according to the GSM standard. Such a system operates in the Time-Division Multiple Access (TDMA) mode.

2. Description of the Related Art

European Patent Application 0 462 773 A2 shows a control circuit for controlling the transmitter power in a TDMA system. A detector feeds back part of the transmitted power to a control input via a differential amplifier. This arrangement controls the level of the transmitter power. A signal applied to another control input of the power amplifier controls the form of the rise and fall of the transmitter power at the beginning and end of a time slot. In circuits of this type problems of stability occur when stringent requirements are made on the waveform of the transmitter power and on the permissible spectral range—such as, for example, in the GSM specifications. Furthermore, temperature dependence of the detector forms an obstruction to the capability of the circuit to operate.

SUMMARY OF THE INVENTION

Therefore, it is an object of the invention to provide a time-division multiplex signal transmission system which can be stabilized in a simple manner and whose capability to operate is unaffected by temperature dependence of the detector.

A transmission system in accordance with the invention includes means for generating a nominal voltage which determines the waveform of the power of the output signal, and means for generating the control voltage from the difference between the detector voltage and the nominal voltage superimposed by a detector quiescent voltage.

For opening the detector at its optimum operating point, the detector voltage contains a quiescent voltage component which is available when the power of the output signal of the power amplifier has an undetectably small value. The detector quiescent voltage is temperature-dependent. This dependence on temperature is compensated for in the arrangement according to the invention, in that the control voltage for the power amplifier is formed from the difference between the detector voltage and the nominal voltage on which the detector voltage is superimposed. The nominal voltage thereby determines both the form and level of the waveform of the power of the output signal of the power amplifier. The voltage difference described does not include a component that results from the detector quiescent voltage. The feedback of the output signal of the power amplifier to the control input of the power amplifier is effected via the detector and the means for generating the control voltage. As the feedback circuit from the output of the power amplifier to the control input is kept short and comprises few phase-angle rotating components, an adequate phase reserve will be obtained so that the stability of such a control circuit is not endangered.

In an embodiment of the invention a first operational amplifier arranged as an integrating controller is used for generating the control voltage.

The integrating controller can be arranged as an I-controller or as a PI-controller comprising an additional P-control unit. With such a controller a first-order low-pass filter in the power amplifier is compensated for. The control circuit advantageously comprises adequate phase reserve to ensure stability.

In a further embodiment of the invention a second diode is connected in series with a first diode used as a detector diode, which diodes have the same parameters.

The detector diode disposed in the detector is used for rectifying an attenuated high-frequency voltage which is derived from the output signal of the power amplifier. In this manner the diode generate the actual voltage of the control circuit. On the output of the detector is available the detector voltage which is influenced by the forward voltage of the detector diode which is temperature-dependent or may also vary as a result of error currents. To compensate for the consequent temperature dependence or dependence on error currents of the detector voltage, a second diode having equivalent parameters is connected in series with the detector diode. This second diode is passed through by the same DC current as the detector diode. Both diodes have the same temperature dependence. The voltage of the second diode is then equal to the forward voltage of the detector diode and is used for compensating for said dependence of the detector voltage.

The invention is further advantageously embodied in that the lead between the first and the second diode is connected to the non-inverting input of a second operational amplifier, in that the other lead of the second diode is connected to a DC voltage potential, in that the output of the second operational amplifier is connected to said DC voltage potential via the series combination of a first and a second resistor and in that the node between the two resistors is connected to the inverting input of the second operational amplifier.

The detector quiescent voltage can easily be varied by means of the DC voltage potential. The circuit described above furthermore derives the detector quiescent voltage from the voltage on the node between first and second diodes, so that this quiescent voltage is available on the output of the second operational amplifier and is used for said compensation for the dependence on temperature and error currents of the detector voltage, without the node between first and second diode being loaded.

The invention is furthermore embodied in that at the beginning of the rise of the control voltage, this control voltage is equal to an initial value which is slightly below a threshold voltage.

The non-linear characteristic curve of the power amplifier has a threshold voltage which is to be applied at least to the control input to amplify a signal applied to the input of the power amplifier. If the control voltage already has said initial value at the beginning of a time slot, there will be minimum delay in the power amplification of the power amplifier.

In addition, it is advantageous that, in a first phase of the rise of the control voltage, the nominal voltage is equal to a bias voltage.

The bias voltage makes it possible for said control circuit to lock before there is a steep slope in the power of the output signal of the power amplifier, or in the transmitter power of the transmitter, respectively. The bias voltage provides that the offset voltages of a controller included in the feedback loop of the control circuit cannot cause the controller to be driven to full power in negative voltage ranges. Such a drive to full power would thwart the operability of the control circuit.

The invention has also an advantageous embodiment in that the first operational amplifier, before the control voltage rises, is arranged as a subtracter having unequal resistance ratios, while the two inputs of the subtracter are supplied with the detector voltage and the nominal voltage superimposed by the detector quiescent voltage.

In this manner the initial value of the control voltage is set at the output of the first operational amplifier with little circuitry and cost.

In another embodiment of the invention the last phase of a control voltage drop is determined by a negative nominal voltage.

If at the end of a time slot the nominal voltage is reduced to the zero value to decrease the transmitter power, the actual voltage, and thus the transmitter power of the transmitter, asymptotically approaches the zero value. However, if in this phase of a negative nominal voltage is applied, the actual voltage and thus the transmitter power of the transmitter drops to the zero value in a considerably shorter period of time.

A further embodiment of the invention is that the power amplifier has only a single input for a receiving the high-frequency input signal and the control voltage.

The high-frequency input signal and the control voltage are separated inside the power amplifier in this embodiment. The transmitter part generating the high-frequency input signal is thereto DC-isolated from the power amplifier by means of a capacitor to avoid the inclusion of the control voltage in this part of the transmitter.

BRIEF DESCRIPTION OF THE DRAWINGS

Embodiments of the invention will be further explained below with reference to the appended drawings, in which:

FIG. 7a shows the waveform of a reference voltage, and

FIG. 7b and 7c show waveforms of a nominal voltage, an actual voltage and a control voltage.

DESCRIPTION OF THE PREFERRED EMBODIMENTS

Figure 1:
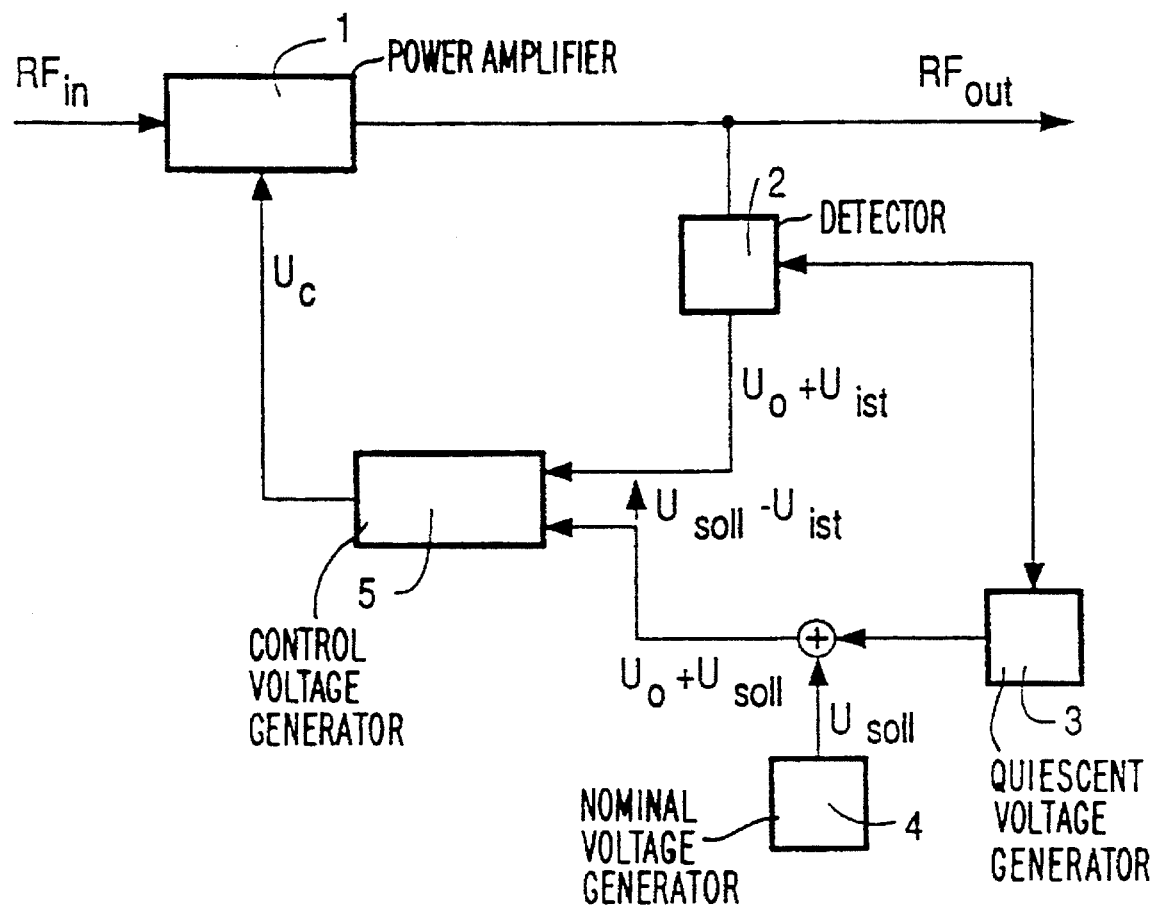
FIG. 1 shows a block circuit diagram of a power amplifier comprising a dedicated control arrangement.

An arrangement according to the invention is shown in FIG. 1 and is, for example, a part of a transmitter of a mobile or base station of a digital mobile radio network according to the GSM standard. Information is transmitted in the TDMA mode. This requires a control of the rise and fall of the transmitter power for the individual time slots. A controllable power amplifier 1 amplifies a high-frequency input signal $RF_{in}$ to a high-frequency output signal $RF_{out}$. A detector 2 is instrumental in converting the power of the output signal $RF_{out}$ i.e. The transmitter power of the transmitter, into a detector voltage which is the sum of a detector quiescent voltage $U_o$ and an actual voltage $U_{ist}$. A circuit block 3 is coupled to the detector 2 and is used for setting the detector quiescent voltage $U_o$ which is generated at an output of the circuit block 3. The circuit block 3 is capable of detecting changes of the detector 2, which are caused by, for example, temperature fluctuations, and processing them in such a way that the voltage at the output of circuit block 3 corresponds to the real detector quiescent voltage $U_o$. The voltage $U_o$ generated by the circuit block 3 is superimposed on a nominal voltage $U_{soll}$ which is generated by a nominal voltage generator 4. The nominal voltage $U_{soll}$ superimposed by the detector quiescent voltage $U_o$ is applied to a first input of a control voltage generator 5. A second input of the control voltage generator 5 is supplied with the detector voltage $U_o+U_{ist}$. An output of the control voltage generator 5, on which a control voltage $U_c$ is available, is connected to a control input of the power amplifier 1.

The power of the high-frequency output signal $RF_{out}$ is detected by the detector 2 and converted into an actual voltage $U_{ist}$. The actual voltage $U_{ist}$ is used as a control parameter for this control circuit. The nominal voltage $U_{soll}$ corresponds to a reference parameter. The consequent control deviation $U_{soll}$ minus $U_{ist}$ determines the control voltage $U_c$ used as a setting parameter. Waveform and value of the nominal voltage $U_{soll}$ thus determine the waveform and the power level of the output signal $RF_{out}$ of the controllable power amplifier 1.

The operation of the detector 2 at a suitable operating point presupposes that the actual voltage $U_{ist}$ is superimposed by a detector quiescent voltage $U_o$. The detector quiescent voltage $U_o$ results from the structure of the detector 2 and the influence of the circuit block 3. This circuit block superimposes the detector quiescent voltage $U_o$ on the nominal voltage $U_{soll}$. The difference between the two voltages available at the two inputs of the control voltage generator 5 is then the same $(U_{soll} - U_{ist})$. This is the control deviation of the control circuit on which the detector quiescent voltage $U_o$ has no effect. A dependence of the detector quiescent voltage $U_o$ on, for example, temperature of supply voltage is compensated for. In addition, the value of the detector quiescent voltage $U_o$ can be influenced by the circuit block 3, so that a suitable DC voltage is available at the two inputs of the control voltage generator 5.

Figure 2:
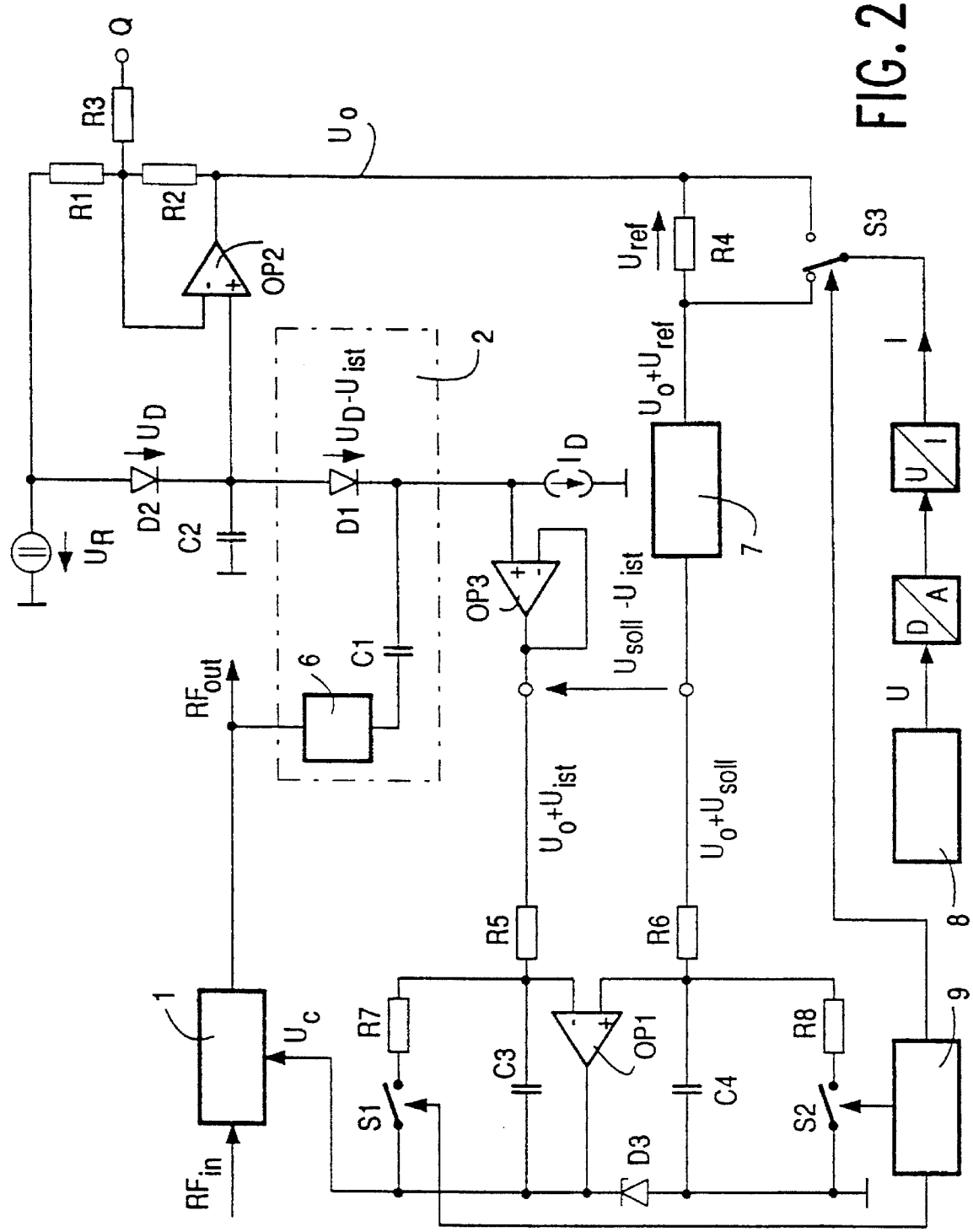
FIG. 2 shows a first circuit arrangement of a power amplifier comprising a dedicated control arrangement.

FIG. 2 shows a circuit diagram of a control circuit represented in FIG. 1. The detector 2 comprises an attenuator 6, a capacitor C1 and a diode D1. The attenuator 6, for example, a stripline, generates an attenuated high-frequency voltage corresponding to the power of the high-frequency output signal $RF_{out}$, which voltage is applied via the capacitor C1 to the diode D1 and is rectified by this diode. The cathode of the diode D1 is connected to the capacitor C1. The anode of the diode D1 is short-circuited with respect to high-frequency by a ground potential via a capacitor C2. The voltage present on diode D1 is forward direction is equal to the forward voltage $U_D$ minus the actual voltage $U_{ist}$. The anode of the diode D1 is further connected to the cathode of a diode D2 at whose anode a voltage $U_R$ is present.

The diode D2 has the same structure as that of the diode D1. The series combination of two resistors R1 and R2 is located between the anode of the diode D2 and the output of an operational amplifier OP2. These resistors have substantially the same resistance value. The inverting input of the operational amplifier OP2 is connected to the point between R1 and R2, and the non-inverting input of the operational amplifier OP2 is coupled to the anode of the diode D1. The non-inverting input of the operational amplifier OP2 is furthermore coupled to an output Q of a digital part of the transmitter via a resistor R3.

Between the cathode of diode D1 and ground potential there is a constant current source which supplies the current $I_D$. In this manner the operating point of the diode D1 is established. The current $I_D$ is selected such that the diode D1 is always conductive when the transmitter is in operation. In the embodiment, $I_D$ is selected to be 60 μA. The voltage present on the cathode of the diode D1 is applied to the inverting input of an operational amplifier OP3 arranged as a voltage follower.

The output of the operational amplifier OP2 is coupled to the input of a fourth-order low-pass filter 7 via a resistor R4. In parallel with the resistor R4 is arranged switch S3 which, in the left position, allows a current I to flow via the resistor R4 to the output of the operational amplifier OP2. When the switch is in the right-hand position, I flows directly to the output of OP2. If the current I is led through the resistor R4, a reference voltage $U_{ref}$ drops at resistor R4. The current I is produced in that a digital circuit 8 produces a control voltage U, which is converted into the current I via a digitizer and a voltage/current converter.

The output of the operational amplifier OP3 is coupled to the inverting input of an operational amplifier OP1 via a resistor R5. The non-inverting input of OP1 is connected to a terminal of a resistor R6, whose other terminal is connected to the output of the low-pass filter 7. In a parallel combination with the section from the inverting input of the operational amplifier OP1 to the output of the operational amplifier OP1 is included, on the one hand, a capacitor C3, and, on the other hand, the series combination of a resistor R7 and a switch S1. The output of OP1 is connected to the cathode of a Zener diode D3, whose anode is connected to ground potential. This serves as a voltage limiter for the control voltage $U_c$ and represents a simply realisable protection circuit. Between the anode of the Zener diode D3 and the non-inverting input of OP1 is arranged the parallel circuit of a capacitor C4 and the series connection of a resistor R8 and a switch S2. The resistors R5, R6 and R7 have the same resistance value. The resistor R8 has a different resistance value, in this case a 50% larger one. The capacitance of capacitors C3 and C4 is the same. The output of the operational amplifier OP1 on which the control voltage $U_c$ is available, is connected to the control input of the power amplifier 1.

The constant current $I_D$ flowing through the two diodes D1 and D2 causes the two diodes to be constantly conductive. A suitable operating point of D1 and D2 can be set by means of $I_D$. If the power of the output signal $RF_{out}$ is equal to zero, only the forward voltage $U_D$ on the diode D1 will drop. $U_D$ is also available on the diode D2. The detector 2 produces in that case its detector quiescent voltage $U_o$ which can be calculated to be $$U_o = U_R - 2 U_D.$$

The detector quiescent voltage can be easily adjusted by $U_R$. The detector quiescent voltage is further available on the output of the operational amplifier OP2. In such a pause in the transmission, in which the power of the output signal $RF_{out}$ is equal to zero, switch S3 has the right-hand switch position. The current I then flows directly into the output of the operational amplifier OP2 and does not cause any voltage drop at resistor R4. As a result, the detector quiescent voltage $U_o$ is available on the output of the low-pass filter 7. $U_o$ is also available on the detector output, as has already been described, and thus on the output of the operational amplifier OP3 arranged as a voltage follower. During a pause in the transmission the switches S1 and S2 are closed. The capacitors C3 and C4 are then irrelevant if that situation occurs.

The circuit section which includes the operational amplifier OP1 and the resistors R5, R6, R7 and R8, operates as a subtracter whose two inputs are connected to the outputs of the operational amplifier OP3 and of the low-pass filter 7. The output of the operational amplifier OP1 represents the output of this subtracter. As R8 has a different resistance value from that of R5, R6 or R7, there is a non-zero voltage on the output of OP1 owing to this asymmetry, although in both cases the detector quiescent voltage $U_o$ is available at the input of the described subtracter. This output voltage of OP1 is equal to an initial value $U_{home}$ of the control voltage $U_c$. This initial value lies slightly below a threshold voltage $U_s$ of the power amplifier 1, as will become apparent from FIG. 3. If the control voltage $U_c$ exceeds the threshold voltage $U_s$, the power amplifier 1 starts amplifying, so that an actual voltage $U_{ist}$ can be detected on the diode D1 of the detector 2.

A transmission is started in that a digital circuit 9 arranged in the transmitter opens the switches S1 and S2 and turns the switch S3 to the left position. The current I now flows through the resistor R4 and causes there a voltage drop $U_{ref}$. The input of the low-pass filter 7 is thus supplied with the sum of $U_o$ and $U_{ref}$. The output of the low-pass filter 7 now supplies the sum of the detector quiescent voltage $U_o$ and the nominal voltage $U_{soll}$. $U_{soll}$ corresponds to the square-wave voltage $U_{ref}$ filtered by the low-pass filter 7. The waveform of the nominal voltage $U_{soll}$ is determined by the filter properties of the low-pass filter 7. The magnitude of $U_{soll}$ can be derived from the resistance value of R4 and from the current I and thus from the voltage U produced by digital circuit 8. The opening of the switches S1 and S2 now causes the operational amplifier OP1 to be arranged as an integral controller. Its time constant is the result of a multiplication of the two entities R5 and C3.

The capacitor C4 is included for reasons of circuit symmetry. The voltage on the output of the operational amplifier OP1 rises, because there is a voltage difference on its inputs and thus at the inputs of the integral controller as a result of the increase of the nominal voltage $U_{soll}$. The consequent rise of the control voltage $U_c$ causes a higher gain factor of the power amplifier 1 to occur, so that the power of the output signal $RF_{out}$ increases. The diode D1 of the detector 2 detects the power of the high-frequency output signal $RF_{out}$ and converts this to an actual voltage $U_{ist}$. At the diode D1 is now available in forward direction the forward voltage $U_D$ minus the actual voltage $U_{ist}$. The voltage on the output of the operational amplifier OP3 rises to the value $U_o$ plus $U_{ist}$. On the two inputs of the integral controller is thus available the difference between $U_{soll}$ and $U_{ist}$. The integral controller provides that the actual voltage $U_{ist}$ is slaved to the nominal voltage $U_{soll}$.

To reduce the power of the output signal $RF_{out}$ of the power amplifier 1 and thus the transmitter power after the data of a time slot have been transmitted, the switch S3 is turned to the right-hand position, so that $U_{ref}$ becomes zero. To accelerate the transmitter power drop, a positive voltage such as, for example, a supply voltage is available on terminal Q if the transmitter is used in mobile stations, which results in a voltage drop to below the detector quiescent voltage $U_o$ on the output of OP2. In the circuit this is experienced as a negative nominal voltage $U_{soll}$, so that the actual voltage $U_{ist}$ and thus the transmitter power, will shortly drop to the zero value. The control voltage $U_c$ will then drop to below the initial value $U_{home}$. Once the switches S1 and S2 are closed, this initial value $U_{home}$ is again built up. This method is especially implemented in mobile stations where there is ample time available for building up again the initial value $U_{home}$ between two time slots.

The feedback path from the output of the power amplifier 1, via the detector 2, the operational amplifier OP3 arranged as a voltage follower, and the integral controller whose output is coupled to the control input of the power amplifier 1, is kept short in this circuit i.e. comprises the fewest possible number of phase-rotating components. In this manner there is a large phase reserve in the control circuit, so that the danger of instability is reduced. The common mode voltage available at the input of the integral controller can be easily adjusted by the voltage $U_R$. With the simplest means it is possible to adhere to the permissible common mode voltage range of the operational amplifier OP1 of the integral controller. Since the detector quiescent voltage $U_o$ does not influence the voltage difference at the inputs of the integral controller, temperature has no effect on the diode D1 of the detector 2.

Figure 3:
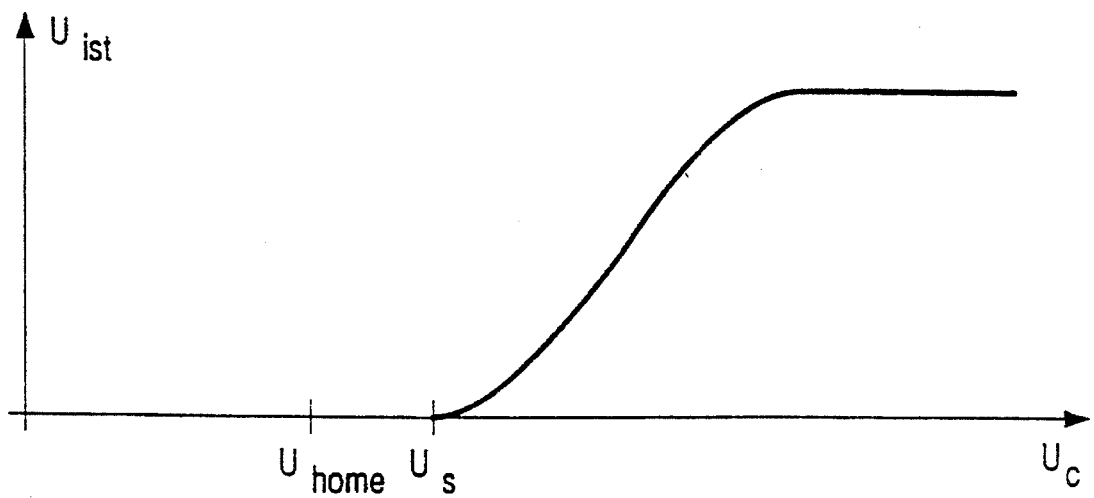
FIG. 3 shows a control characteristic curve of the power amplifier.

The characteristic curve shown in FIG. 3 clarifies the non-linear behaviour of the power amplifier 1. The actual voltage $U_{ist}$ is plotted against the control voltage $U_c$. It will be clear that the actual voltage $U_{ist}$ assumes values greater than zero only for control voltages exceeding a threshold voltage $U_s$. For example, an initial value $U_{home}$ is shown of the control voltage $U_c$, which is produced as described with reference to FIG. 2. When a transmission is commenced, the control voltage $U_c$ available on the output of the integral controller is to be increased merely by the difference value between the threshold voltage $U_s$ and the initial value $U_{home}$. In this manner the switch-on delay of the transmitter is minimized by the controlled power amplifier 1.

Figure 4:
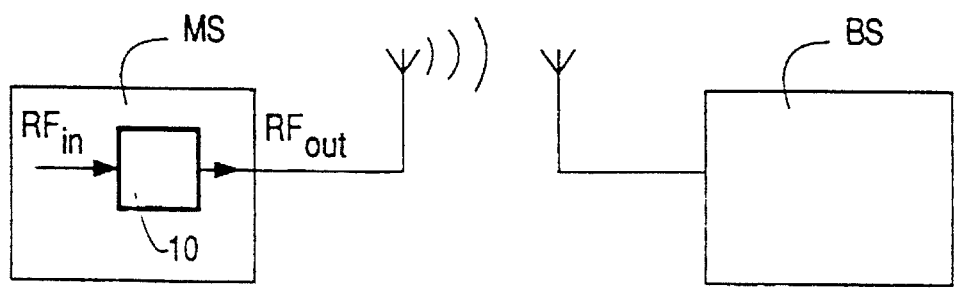
FIGS. 4 and 5 show a transmission system for time-division multiplex signal transmission.
Figure 5:
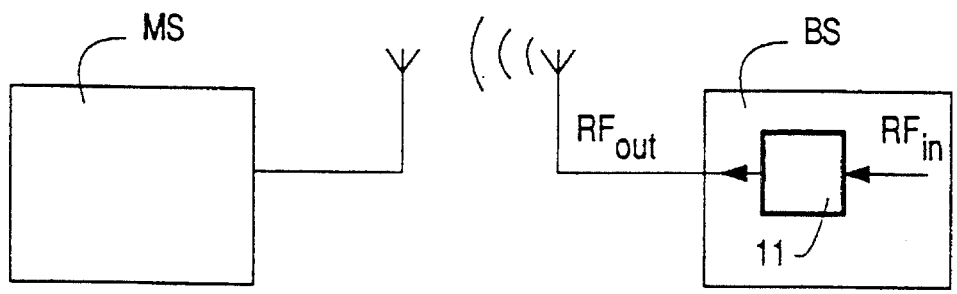

FIGS. 4 and 5 show a transmission system for time-division signal transmission. A mobile radio system is shown which comprises a base station BS and a mobile station MS. They comprise a controllable power amplifier with control circuit 10, 11 as shown in the FIGS. 1, 2 or 6. In FIG. 4 the mobile station MS is in the transmit mode, in FIG. 5 the base station BS in the transmit mode.

Figure 6:
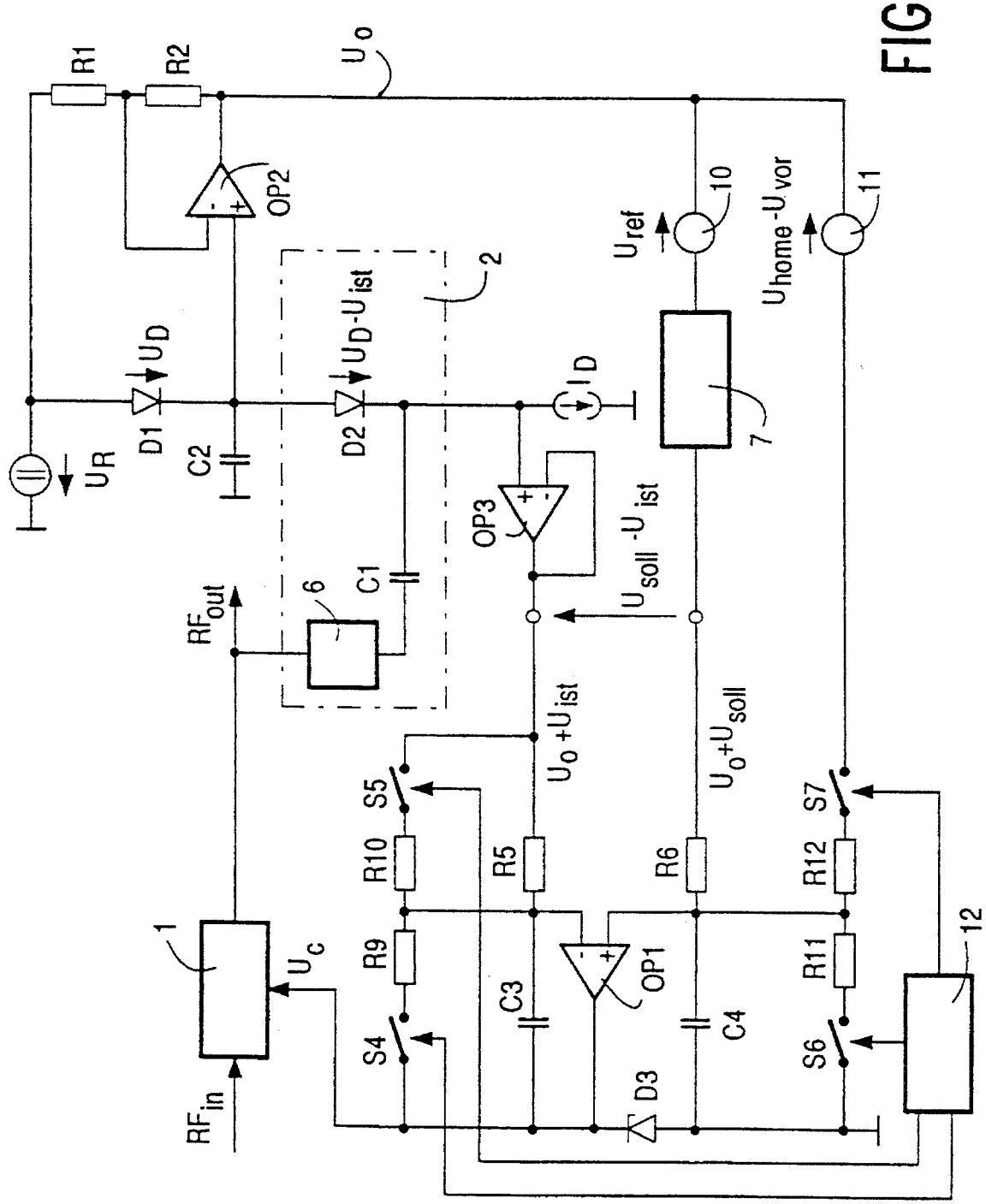
FIG. 6 shows a second circuit arrangement of a power amplifier comprising a dedicated control arrangement.

FIG. 6 shows a controllable power amplifier 1 comprising a modified control arrangement. Compared with FIG. 2 there are the following modifications: Between the output of the operational amplifier OP2 and the input of the low-pass filter 7 is inserted a voltage source 10 which supplies the voltage $U_{ref}$. The waveform of this voltage $U_{ref}$ is shown in FIG. 7a. Between the output of operational amplifier OP2 and the non-inverting input of the operational amplifier OP1 lies the series combination of a voltage source 11, a switch S7 and a resistor R12. The integral controller comprising the components OP1, C3, C4, R5 and R6 is unmodified compared with FIG. 2. The series combination of a switch S4 and a resistor R9 is arranged in parallel with the capacitor C3. The series combination of a resistor R10 and a switch S5 is arranged in parallel with the resistor R5. The series combination of a resistor R11 and a switch S6 is arranged in parallel with the capacitor C4, R5, R6, R9, R10, R11 and R12 have all the same resistance value. The switches S4, S5, S6 and S7 are controlled by a circuit block 12 which is located in the digital section of the transmitter. During a transmission pause, in which the power of the output signal $RF_{out}$ and thus also the actual voltage $U_{ist}$ are equal to zero, the voltage source 10 produces a voltage $U_{ref}$ which is equal to the bias voltage $U_{vor}$. The operational amplifier OP1 arranged as a subtracter when the switches S4 to S7 are closed thus supplies the initial value $U_{home}$ in a transmission pause. A transmission is commenced when the circuit block 12 opens the switches S4 to S7. The resistors R9 to R12 and the voltage source 11 now no longer have any effect. OP1 operates together with C3, R5, C4 and R6 as an integral controller as has already been described with reference to FIG. 2.

FIGS. 7a and 7b outline waveforms of the voltage $U_{ref}$ shown in FIG. 6, of the control voltage $U_c$, the nominal voltage $U_{soll}$ and the actual voltage $U_{ist}$. For the instants t<0, which lie in a transmission pause, the voltage $U_{ref}$ is equal to the bias voltage $U_{vor}$. The control voltage $U_c$ is for these instants equal to an initial value $U_{home}$. $U_{ref}$ continues to have the value of the bias voltage $U_{vor}$ until instant t1. At instant t=0 the build-up phase of the integral controller starts. This appears from a rise of the control voltage $U_c$ until instant t0. At instant t0 the actual voltage $U_{ist}$ starts to rise until it has reached the nominal voltage level $U_{soll}$, or the bias voltage level $U_{vor}$. From that instant to the instant t1 the control voltage $U_c$ continues to be constant. The integral controller has built up. At instant t1 the actual rise of the power of the output signal $RF_{out}$ starts with which power the digital transmit signals are sent. To this end the voltage $U_{ref}$ is raised to the value $U_{ref,max}$. By filtering with low-pass filter 7, the steep edge of $U_{ref}$ is transformed into a less steeply rising edge of the nominal voltage $U_{soll}$. The actual voltage $U_{ist}$ is slaved to the nominal voltage $U_{soll}$. If the two voltages have reached their maximum value, a data transmission can be effected. The time axis was interrupted, because the transmit time, available for a data transmission, cannot be represented full-size in the drawing because of its length. At instant t2 the transmission of data is terminated. Now $U_{ref}$ is lowered to the negative voltage $U_{neg}$. This causes the nominal voltage $U_{soll}$ to drop, the actual voltage $U_{ist}$ to drop and thus the control voltage $U_c$ to drop. At instant t3 the actual voltage $U_{ist}$ has reached the zero value. This causes an increased drop of the control voltage $U_c$. Until the switches S4 to S7 of FIG. 4 are again closed at a later instant in the present transmission pause occurring now, the value of the control voltage $U_c$ will increase again to its initial value $U_{home}$.

The waveform of the transmitter power can be controlled by the defined circuits in such a way that the time masks and frequency spectra for digital mobile telephones according to the GSM standard and their dedicated base stations are adhered to.

I claim:

1. Transmission system for time-division multiplex signal transmission, comprising at least a transmitter which includes a power amplifier having a control input supplied with a control voltage ($U_c$), for amplifying a high-frequency input signal ($RF_{in}$) to a high-frequency output signal ($RF_{out}$), a detector supplying a detector voltage ($U_o+U_{ist}$) for detecting the power of the output signal ($RF_{out}$), the detector voltage representing the sum of a detector quiescent voltage ($U_o$) and an actual voltage ($U_{ist}$), means for generating a nominal voltage ($U_{soll}$) which determines the waveform of the power of the output signal ($RF_{out}$), integrating controller means for generating the control voltage ($U_c$) responsive to the detector voltage ($U_o+U_{ist}$) and the nominal voltage ($U_{soll}$) superimposed by the detector quiescent voltage ($U_o$), wherein said integrating controller comprises a first operational amplifier (OP1), and controllable switching means for selectively connecting additional circuit elements with said integrating controller, said switching means being controllable in one of two switching states for affecting the control voltage at the output of the integrating controller, wherein in a first switching state activated before the control voltage rises, the additional circuit elements and said integrating controller are arranged as a subtracter whereby an initial value of the control voltage is established at the output of the first operational amplifier, the control voltage thereby being set equal to an initial value ($U_{home}$) which is slightly below a threshold turn-on voltage ($U_s$) of the power amplifier, and wherein in a second switching state, the additional circuit elements no longer have any effect on the integrating controller.

2. Transmission system as claimed in claim 1, wherein a first diode (D1) is used in said detector as a detector diode, the detector voltage being influenced by a forward voltage of the detector diode, the forward voltage of the detector diode being temperature-dependent and may also vary as a result of error currents, and wherein a second diode (D2) is connected in series with the first diode (D1), which diodes have the same parameters, further wherein a voltage of the second diode is equal to the forward voltage of the detector diode, the second diode for compensating for a dependence of the detector voltage on the forward voltage of the detector diode.

3. Transmission system as claimed in claim 2, wherein a lead connection between the first and the second diodes (D1, D2) is connected to a non-inverting input of a second operational amplifier (OP2), further wherein the other lead of the second diode (D2) is connected to a DC voltage potential ($U_R$), still further wherein an output of the second operational amplifier (OP2) is connected to said DC voltage potential ($U_R$) via a series combination of a first and a second resistor (R1, R2), and wherein a node between the two resistors is connected to the inverting input of the second operational amplifier (OP2), the output of the second operational amplifier corresponding to the detector quiescent voltage ($U_o$).

4. Transmission system as claimed in claim 1, wherein in a first phase of a rise of the control voltage ($U_c$), the nominal voltage ($U_{soll}$) is equal to a bias voltage ($U_{vor}$).

5. Transmission system as claimed in claim 1, wherein a last phase of a drop of the control voltage ($U_c$) is determined by a negative nominal voltage ($U_{neg}$).

6. Transmission system as claimed in claim 1, wherein said power amplifier has only a single input for receiving the high-frequency input signal ($RF_{in}$) and the control voltage ($U_c$).

7. Transmitter for time-division multiples signal transmission, which includes a power amplifier having a control input supplied with a control voltage ($U_c$), for amplifying a high-frequency input signal ($RF_{in}$) to a high-frequency output signal ($RF_{out}$), a detector supplying a detector voltage ($U_o+U_{ist}$) for detecting the power of the output signal ($RF_{out}$), the detector voltage representing the sum of a detector quiescent voltage ($U_o$) and an actual voltage ($U_{ist}$), means for generating a nominal voltage ($U_{soll}$) which determines the waveform of the power of the output signal ($RF_{out}$), integrating controller means for generating the control voltage ($U_c$) responsive to the detector voltage ($U_o+U_{ist}$) and the nominal voltage ($U_{soll}$) superimposed by the detector quiescent voltage ($U_o$), wherein said integrating controller comprises a first operational amplifier (OP1), and controllable switching means for selectively connecting additional circuit elements with said integrating controller, said switching means being controllable in one of two switching states for affecting the control voltage at the output of the integrating controller, wherein in a first switching state activated before the control voltage rises, the additional circuit elements and said integrating controller are arranged as a subtracter whereby an initial value of the control voltage is established at the output of the first operational amplifier, the control voltage thereby being set equal to an initial value ($U_{home}$) which is slightly below a threshold turn-on voltage ($U_s$) of the power amplifier, and wherein in a second switching state, the additional circuit elements no longer have any effect on the integrating controller.

8. Control circuit for a transmitter for time-division multiplex signal transmission, which includes:

a power amplifier having a control input supplied with a control voltage ($U_c$), for amplifying a high-frequency input signal ($RF_{in}$) to a high-frequency output signal ($RF_{out}$), a detector supplying a detector voltage ($U_o+U_{ist}$) for detecting the power of the output signal ($RF_{out}$), the detector voltage representing the sum of a detector quiescent voltage ($U_o$) and an actual voltage ($U_{ist}$), means for generating a nominal voltage ($U_{soll}$) which determines the waveform of the power of the output signal ($RF_{out}$), integrating controller means (5) for generating the control voltage ($U_c$) responsive to the detector voltage ($U_o+U_{ist}$) and the nominal voltage ($U_{soll}$) superimposed by the detector quiescent voltage ($U_o$), wherein said integrating controller comprises a first operational amplifier (OP1), and controllable switching means for selectively connecting additional circuit elements with said integrating controller, said switching means being controllable in one of two switching states for affecting the control voltage at the output of the integrating controller, wherein in a first switching state activated before the control voltage rises, the additional circuit elements and said integrating controller are arranged as a subtracter whereby an initial value of the control voltage is established at the output of the first operational amplifier, the control voltage thereby being set equal to an initial value ($U_{home}$) which is slightly below a threshold turn-on voltage ($U_s$) of the power amplifier, and wherein in a second switching state, the additional circuit elements no longer have any effect on the integrating controller.

* * * * *